(12) United States Patent
Kim et al.

(10) Patent No.: US 7,943,951 B2
(45) Date of Patent: May 17, 2011

(54) LIGHT EMITTING DEVICE PACKAGE

(75) Inventors: Hyung-kun Kim, Suwon-si (KR);
Yu-sik Kim, Suwon-si (KR)

(73) Assignee: Samsung LED Co., Ltd., Suwon, Gyunggi-Do (KR)

( * ) Notice: Subject to any disclaimer, the term of this patent is extended or adjusted under 35 U.S.C. 154(b) by 60 days.

(21) Appl. No.: 11/452,410

(22) Filed: Jun. 14, 2006

(65) Prior Publication Data
US 2006/0284209 A1    Dec. 21, 2006

(30) Foreign Application Priority Data
Jun. 17, 2005    (KR) .................. 10-2005-0052578

(51) Int. Cl.
*H01L 33/00* (2010.01)
(52) U.S. Cl. .......................... 257/100; 438/22
(58) Field of Classification Search .......... 257/100
See application file for complete search history.

(56) References Cited

U.S. PATENT DOCUMENTS

| | | | |
|---|---|---|---|
| 6,949,772 B2 * | 9/2005 | Shimizu et al. | 257/99 |
| 2002/0021085 A1 * | 2/2002 | Ng | 313/499 |
| 2003/0025117 A1 | 2/2003 | Isokawa et al. | |
| 2004/0183081 A1 | 9/2004 | Shishov et al. | |
| 2004/0223315 A1 * | 11/2004 | Suehiro et al. | 362/84 |
| 2005/0072981 A1 * | 4/2005 | Suenaga | 257/88 |
| 2006/0138443 A1 * | 6/2006 | Fan et al. | 257/100 |

FOREIGN PATENT DOCUMENTS

JP    2003-282955 A    3/2003

OTHER PUBLICATIONS

Office Action issued by Korean Intellectual Property Office on Mar. 25, 2008.

* cited by examiner

*Primary Examiner* — Quoc D Hoang
*Assistant Examiner* — Tony Tran
(74) *Attorney, Agent, or Firm* — Buchanan Ingersoll & Rooney PC (57) ABSTRACT

A light emitting device package is provided. The light emitting device package comprises a base substrate on which a wiring pattern is formed; a light emitting device mounted on the base substrate to emit light when supplied with driving power through the wiring pattern; a molded lens stably seated on the base substrate and having an inner space for sealing the light emitting device and reflective surfaces formed along outer sides facing the inner space to guide light from the light emitting device in an effective display direction; and a sealing resin between the inner space to bond the base substrate to the molded lens, whereby the packaging structure is simplified so that an assembly process and reliability testing are simplified, process losses due to defects are minimized, and the light extraction efficiency from the light emitting device and heat-dissipation performance are improved.

28 Claims, 5 Drawing Sheets

LIGHT EMITTING DEVICE PACKAGE

CROSS-REFERENCE TO RELATED PATENT APPLICATION

This application claims the benefit of Korean Patent Application No. 10-2005-0052578, filed on Jun. 17, 2005, in the Korean Intellectual Property Office, the disclosure of which is incorporated herein in its entirety by reference.

BACKGROUND OF THE DISCLOSURE

1. Field of the Disclosure

The present disclosure relates to a light emitting device package, and more particularly, to a light emitting device package having a simple improved structure which provides a higher light extraction efficiency and heat-dissipation performance, and minimizes process losses due to defects.

2. Description of the Related Art

Figure 1:
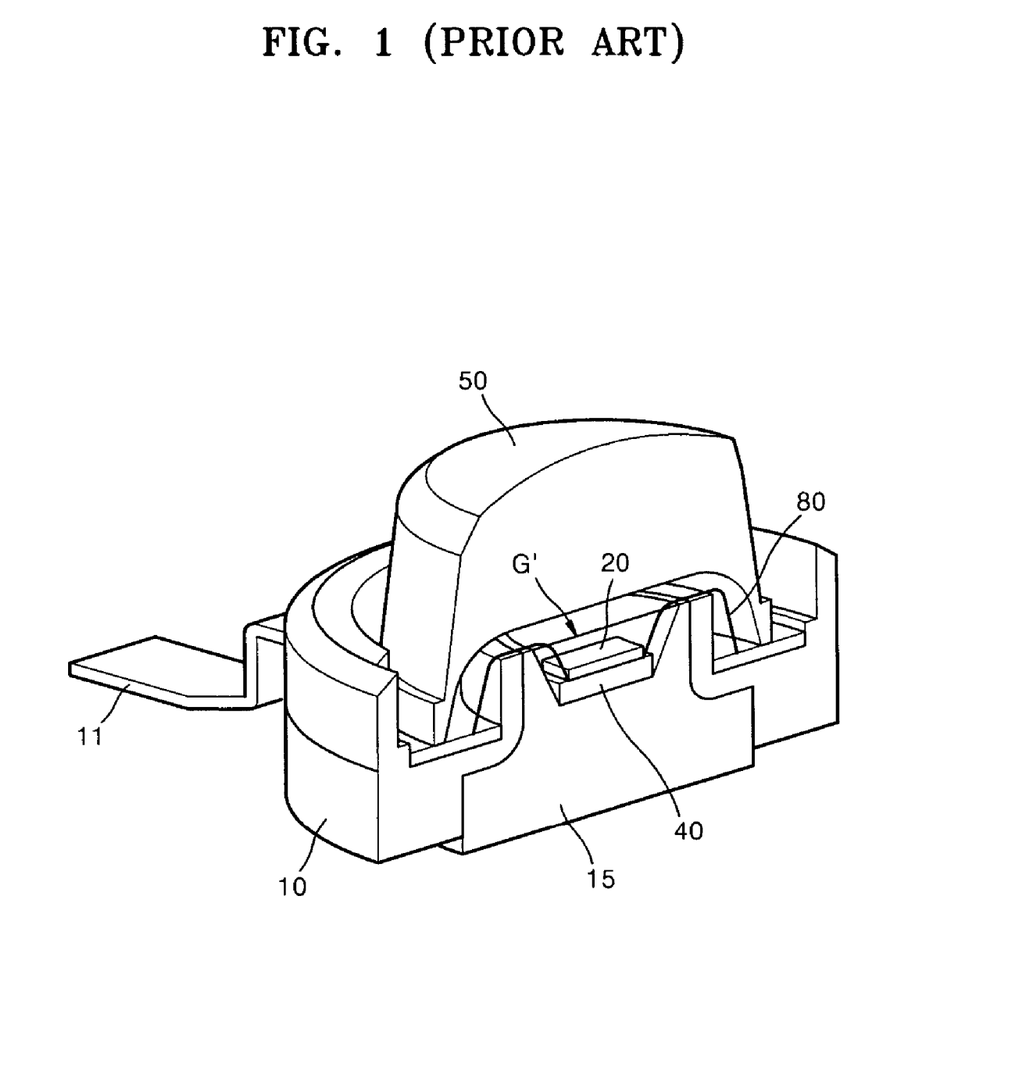
FIG. 1 is a sectional view of the structure of a light emitting diode package of the prior art.

FIG. 1 illustrates the sectional structure of a light emitting diode (LED) package of the prior art. Referring to FIG. 1, the LED package includes an LED as a light emitting device 20, a heat sink 15 on which the light emitting device 20 is mounted, and a sub-mount 40 between the light emitting device 20 and the heat sink 15. A package body 10 surrounds the heat sink 15 to form the outside of the package, and a lead 11 is electrically connected to the light emitting device 20 through a metal wire 80 that extends out of the package body 10. A plastic lens 50 is mounted on top of the package body 10 so that the light emitting device 20 is sealed therebetween. Molding resin (not shown) is injected into an internal space G' which contains the light emitting device 20, to mechanically and electrically protect the light emitting device 20 from the external environment.

The package parts such as the heat sink 15, the package body 10 and the plastic lens 50 are formed of different materials, so that there are complexities in the prior art in that a number of processes are required to manufacture the package, and the manufacturing cost is increased. Another complication of the prior art is that since the package is tested after assembly, if it is defective, the effort and cost of assembly is wasted. Meanwhile, a reflective surface may be formed around the light emitting device to guide light in the desired direction. However, in the prior art, the reflective surface is formed of AlN or a metallic material that is hard to machine, causing difficulty in increasing the light extraction efficiency.

SUMMARY OF THE DISCLOSURE

The present invention may provide a light emitting device package having a simplified structure that is capable of increased light extraction efficiency and heat-dissipation performance.

The present invention also may provide a light emitting device package which minimizes process losses due to defects.

According to an aspect of the present invention, there may be provided a light emitting device package including a base substrate on which a wiring pattern is formed; a light emitting device mounted on the base substrate to emit light when supplied with driving power through the wiring pattern; a molded lens stably seated on the base substrate and having an inner space for sealing the light emitting device and reflective surfaces formed along outer sides facing the inner space to guide light from the light emitting device in an effective display direction; and a sealing resin between the inner space to bond the base substrate to the molded lens.

The molded lens may have a revolution body shape symmetrical about one axis.

The reflective surface may be inclined at a predetermined angle with respect to the center axis of the molded lens.

The angle between both reflective surfaces formed symmetrically about the center axis may satisfy the following relationship: $0° < \theta < 180°$.

The molded lens may have a transmission surface curved in a semi-spherical shape and a reflective surface inclined inward from the outer circumference of the transmission surface.

The reflective surface may be formed by laminating a thin film of Ag or Al on a transparent body of the molded lens, or by inserting a ring member of Ag or Al into a transparent body of the molded lens.

The transparent body inside the reflective surface may have a diffraction pattern consisting of a plurality of continuous gratings, for example, a plurality of embossed portions.

The light emitting device may be buried in a fluorescent layer converting emitted light of the light emitting device into an effective display light.

The inner space may have a maximum height, measured in the direction of the center axis, smaller than a maximum height of the reflective surface measured in the direction of the center axis.

The inner space may have a rectangular or semi-circular cross-section whose bottom surface is open.

The inner space may have an edge portion defined by a sidewall thereof and a surface opposite to the bottom thereof, and the edge portion may be an angled portion or a round portion with a curvature having a diameter equal to the vertical height of the inner space.

The light emitting device may be mounted on the base substrate by the use of flip-chip bonding.

The base substrate may be formed of a ceramic material of SiC, AlN, or Si.

A reflective coating layer is formed on the base substrate surrounding the light emitting device, to reflect light emitted by the light emitting device.

The reflective coating layer may be a metallic layer of Ag or Al.

According to another embodiment of the present invention, there is provided a light emitting device package including a base substrate on which a wiring pattern is formed; a light emitting device mounted on the base substrate to emit light when supplied with driving power through the wiring pattern; a sub-mount interposed between the base substrate and the light emitting device to thermally and electrically mediate therebetween; a molded lens stably seated on the base substrate and having an inner space for sealing the light emitting device together with the sub-mount, and reflective surfaces formed along the outer sides facing the inner space to guide light from the light emitting device in an effective display direction; and a sealing resin injected into the inner space to bond the base substrate to the molded lens.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

Figure 2:
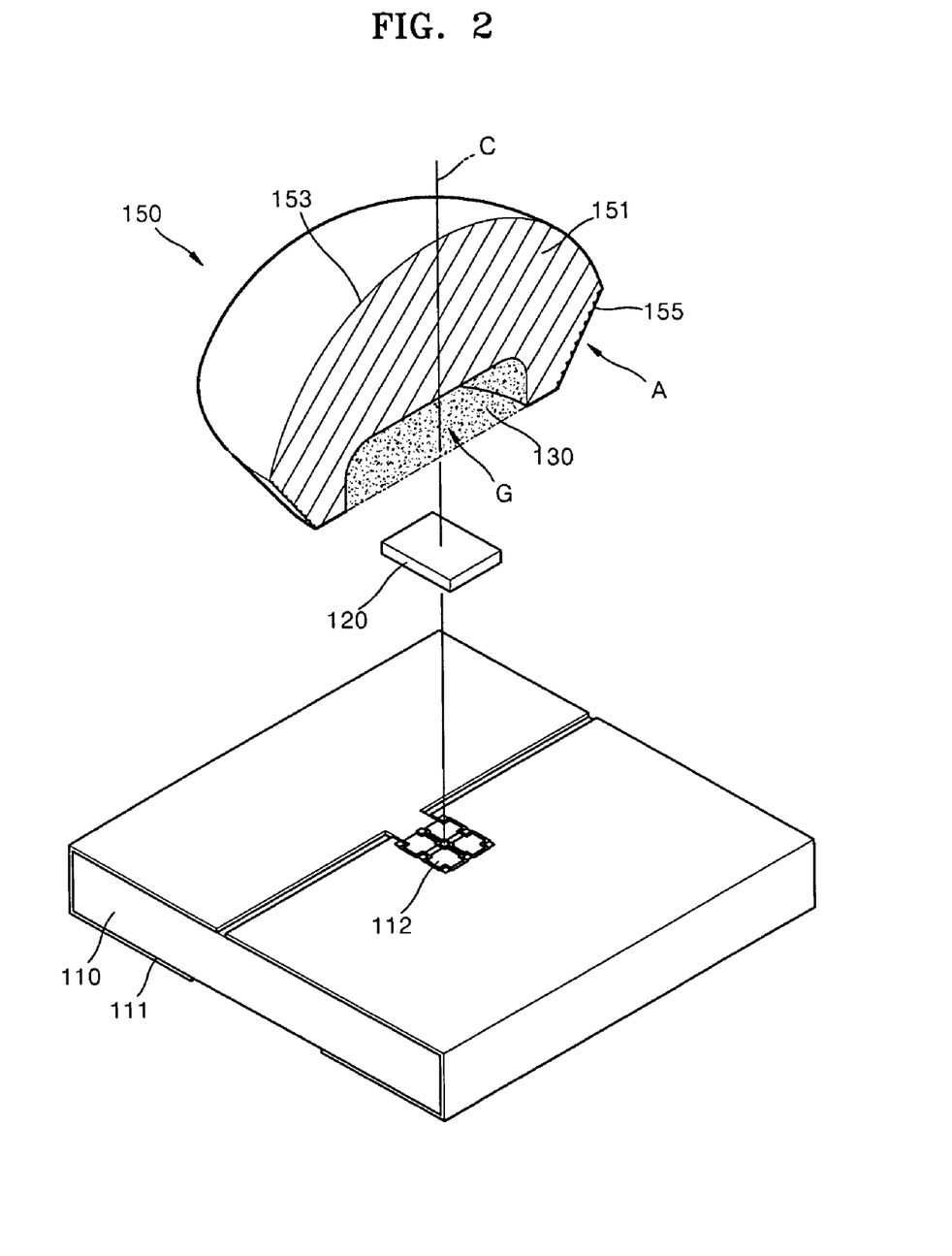
FIG. 2 is an exploded perspective view of a light emitting device package according to a first embodiment of the present invention.

A light emitting device package of the present invention will now be described more fully with reference to the accompanying drawings, in which preferred exemplary embodiments of the invention are shown. FIG. 2 is an exploded perspective view of the light emitting device package according to a first embodiment of the present invention. Referring to this drawing, the light emitting device package includes a base substrate 110 on which a wiring pattern 111 is formed, a light emitting device 120 mounted on the base substrate 110 to emit light when supplied with power via the wiring pattern 111, a molded lens 150 stably seated on the base substrate 110 to cover the light emitting device 120 and extract light emitted from the light emitting device 120 with high efficiency, and a sealing resin 130 injected into an inner space G between the molded lens 150 and the base substrate 110 to bond the molded lens 150 to the base substrate 110. The light emitting device 120 includes an electrode pattern (not shown), through which electric power is supplied, to emit light substantially radially. The light emitting device 120 is packaged between the base substrate 110 and the molded lens 150 coupled so as to face each other, more specifically, positioned in the inner space G formed to the molded lens 150 side. The light emitting device 120 can be any well known light emitting diode or laser diode, and will not be described here. The light emitting device 120 is mounted on the base substrate 110 and electrically connected to an external circuit (not shown) through the wiring pattern 111. The external circuit is generally a printed circuit board, and supplies driving power to the light emitting device 120.

The light emitting device 120 may be mounted on the base substrate 110 by the use of flip-chip bonding. More specifically, the light emitting device 120 is mounted on the base substrate 110 such that a light emitting portion faces upward, and a conductive solder layer or a conductive solder ball (not shown) is interposed between the light emitting device 120 and the base substrate 110 to create an electrical and physical bond therebetween. Thereafter, a bonding pad 112 of the base substrate 120 and a corresponding electrode pad (not shown) of the light emitting device 120 are electrically connected together. The conductive solder layer or solder ball may be formed of a material having a Sn-based solder as a main component, such as Au/Sn, Sn/Ag, etc. However, the bonding method between the light emitting device 120 and the base substrate 110 is not limited to flip-chip bonding, and may be performed by wire bonding using a highly conductive metal wire such as Au or Ag, etc. The base substrate 110 may be formed of, for example, a ceramic material such as AlN or SiC, or Si, that is an insulator for preventing short circuits with the wiring pattern 111 as well as an excellent thermal conductor.

Although not shown in the drawing, a reflective coating layer may be formed on the base substrate 110 where the light emitting device 120 is mounted of a highly reflective metallic thin layer such as a thin Al or Ag layer. This reflective coating layer reflects light emitted by the light emitting device to avoid optical loss and raise the light extraction efficiency.

Figure 3:
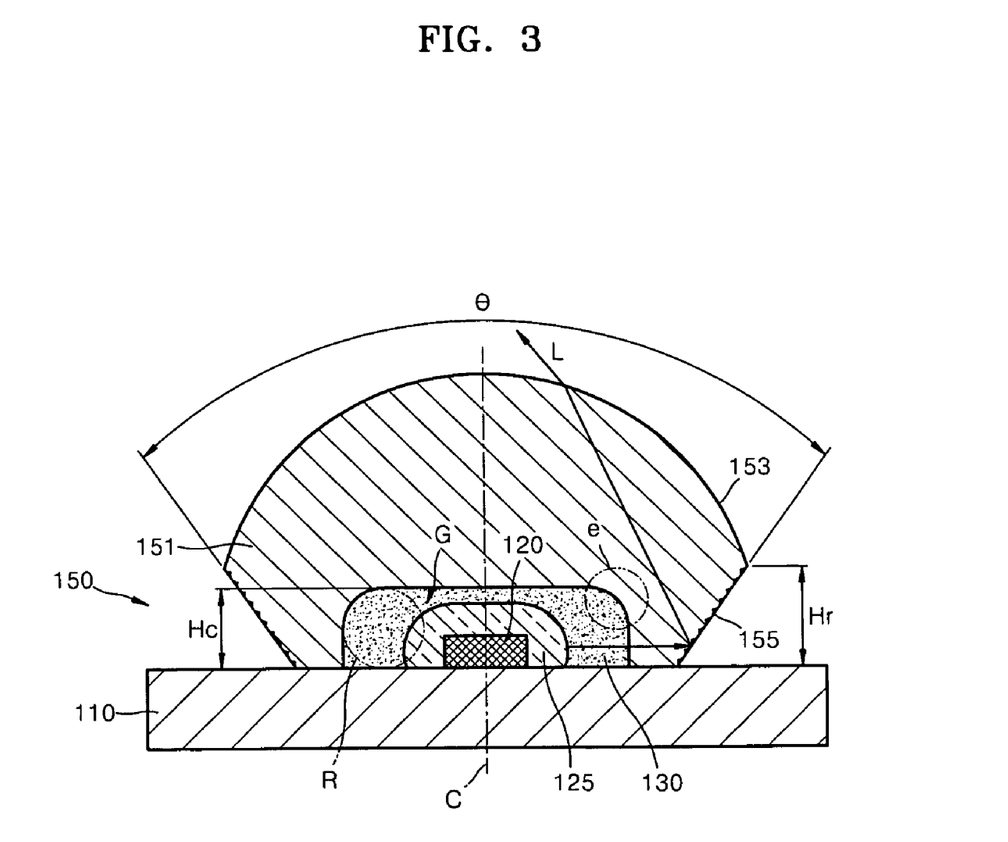
FIG. 3 is a sectional view of the light emitting device package of FIG. 2.

FIG. 3 illustrates the sectional structure of the light emitting device package shown in FIG. 2. Referring to the drawing, the molded lens 150 is safely seated on the base substrate 110 to form an upper portion of the package while covering and sealing the light emitting device 120 on the substrate. The molded lens 150 includes an inner space G containing the light emitting device 120 and a transparent body 151 in the shape of a revolution body with a center axis marked C. The molded lens may be formed of a material selected from the group consisting of glass, thermoplastic polymer, thermosetting polymer (e.g., epoxy resin), and silicone resin. The molded lens 150 has a semi-spherical transmission surface 153 for emitting light which is radially emitted from the light emitting device 120, and a reflective surface 155 inclined inward from the transmission surface 153 to reflect light emitted in a substantially lateral direction from the light emitting device 120. The transmission surface 153 and the reflective layer 155 preferably have a symmetrical structure so that light from the light emitting device 120 is emitted with a constant distribution. The transmission surface 153 is not limited to a semi-spherical shape, but may have a flat planar shape. The external shape of the molded lens 150 may be changed to various shapes.

The reflective surface 155 is disposed to face the inner space G to reflect light L emitted in a lateral direction from the light emitting device 120, to guide it in an effective display direction. In a general application of the light emitting device 120, the effective display direction is an angle range between −60° and +60° about the center axis C. The reflective surface 155 reflects light L emitted in a substantially lateral direction, i.e., a direction parallel or approximately parallel to a reference surface of the base substrate 110, from the light emitting device 120 upwards approaching the C-axis. To this end, the reflective surface 155 is formed so as to be inwardly inclined. The reflective surfaces are preferably formed symmetrically about the C-axis, and the angle θ between the reflective surfaces 155 is preferably in the range of 0<θ<180°. For reference, if the angle θ between the reflective surfaces 155 becomes 0°, the reflective surfaces 155 are perpendicular to the base substrate 110 and it is difficult to guide lateral optical rays in the display direction, and if the angle θ becomes 180°, the reflective surfaces 155 are parallel to the base substrate 110 and very little reflection is possible.

The reflective surfaces 155 are located outside the inner space G, which contains the light emitting device 120, to reflect light L emitted in a lateral direction from the light emitting device 120, to direct the optical path upward in the effective display direction. Accordingly, the vertical height Hr of the reflective surface 155 preferably includes an extra margin above the vertical height Hc of the inner space G. Therefore, if the inner space has a semi-spherical shape, unlike the illustration, the vertical height of the reflective surface is preferably higher than the convex-apex of the inner space.

The reflective surface 155 can be obtained by depositing a high reflectivity metal layer such as Al or Ag on the transparent body 151 of the molded lens 150. Alternatively, the reflective surface can be formed by fixing a loop type ring member made from a highly reflective metallic material into the lower circumference of the molded lens.

The inner space G may have a rectangular cross-section. However, the shape of the inner space G is not necessarily limited to this, and may be modified into various shapes corresponding to an inner structure containing the light emitting device 120. For example, the cross-section of the inner space G may be semi-circular. As shown in the drawing, an edge portion e defined by an upper surface and a sidewall of the inner space G may have a rounded shape, which may be a portion of a circle R having a diameter equal to the vertical height Hc of the inner space G. Alternatively, the edge portion e of the inner space G may have an angled shape.

Meanwhile, the light emitting device 120 is buried in a fluorescent layer 125 formed on the base substrate 110, and light emitted from the light emitting device 120 is converted into effective display light by the fluorescent layer 125. The light emitting device 20 can emit ultraviolet light, visible light, or light of infrared wavelengths according to the kind of the light emitting device. For example, if the light emitting device 120 emits ultraviolet light, the florescent layer 125 has a fluorescent substance that is excited by ultraviolet rays, and emits monochromatic light as its energy level drops. Such a fluorescent substance may include a yttrium-based fluorescent substance.

The sealing resin 130 is applied to the outside of the fluorescent layer 125 to fill the inner space G. The sealing resin 130 is preferably made from a high molecular weight resinous material having an adhesive property to bond the molded lens 150 to the base substrate 110, and a good transmittance for improving the light extraction efficiency. For example, the sealing resin may be an epoxy resinous material. The sealing resin 130 also protects a flip-chip bonding portion between the light emitting device 120 and the base substrate 110 from the external environment.

Figure 4:
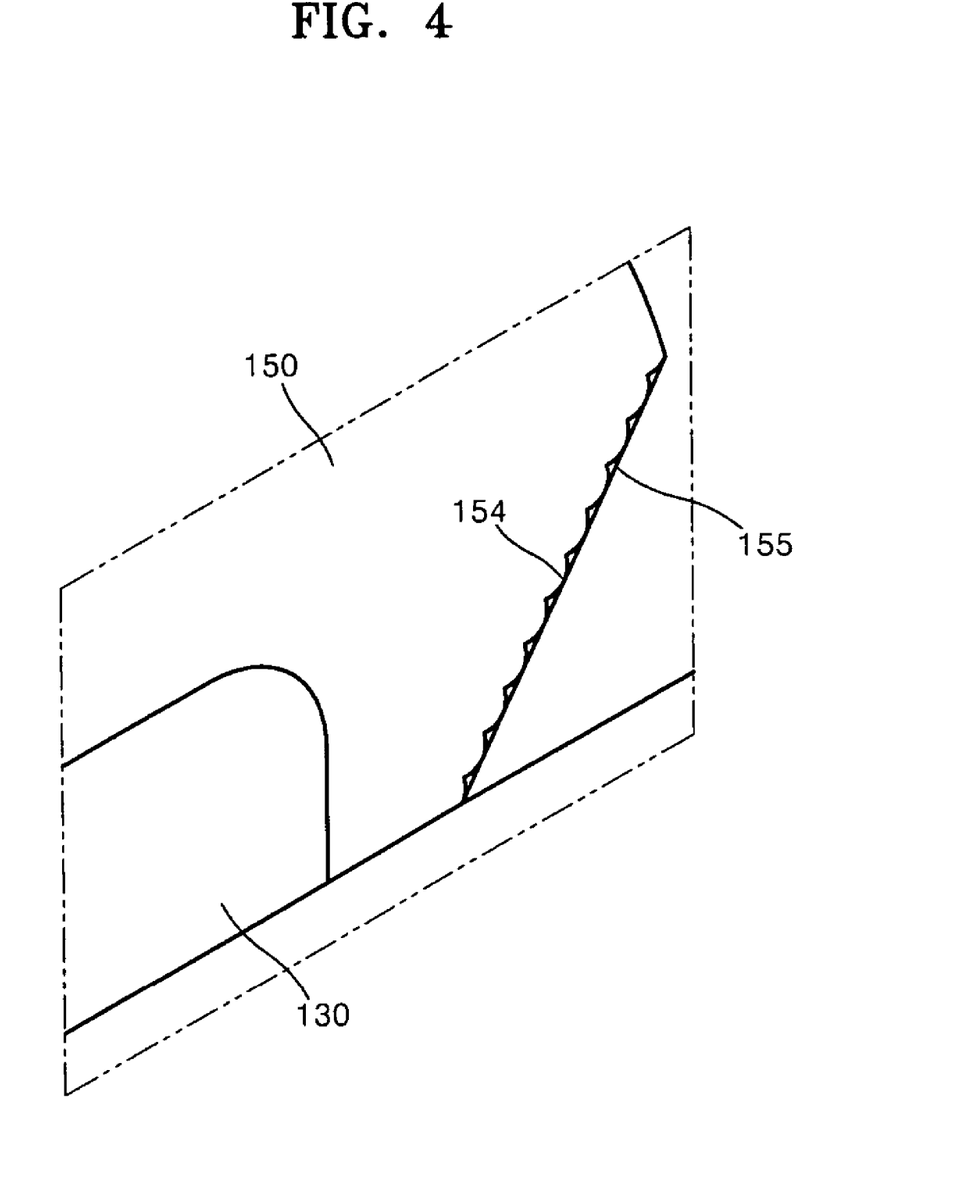
FIG. 4 is an enlarged perspective view of a portion A of FIG. 2.

FIG. 4 is an enlarged view of a portion A of the reflective surface shown in FIG. 2. Referring to the drawing, a diffraction pattern layer 154, in which embossed gratings are continuously repeated, is formed on the body of the molded lens 150 on the inside of the reflective surface 155. The diffraction pattern layer 154 guides incident light upwards with a high reflection efficiency, contributing to the reflection of the reflective surface 155 and the light extraction efficiency. The diffraction pattern layer 154 may be a diffraction grating formed of sine waves or square waves repeated with a constant grating period.

Figure 5:
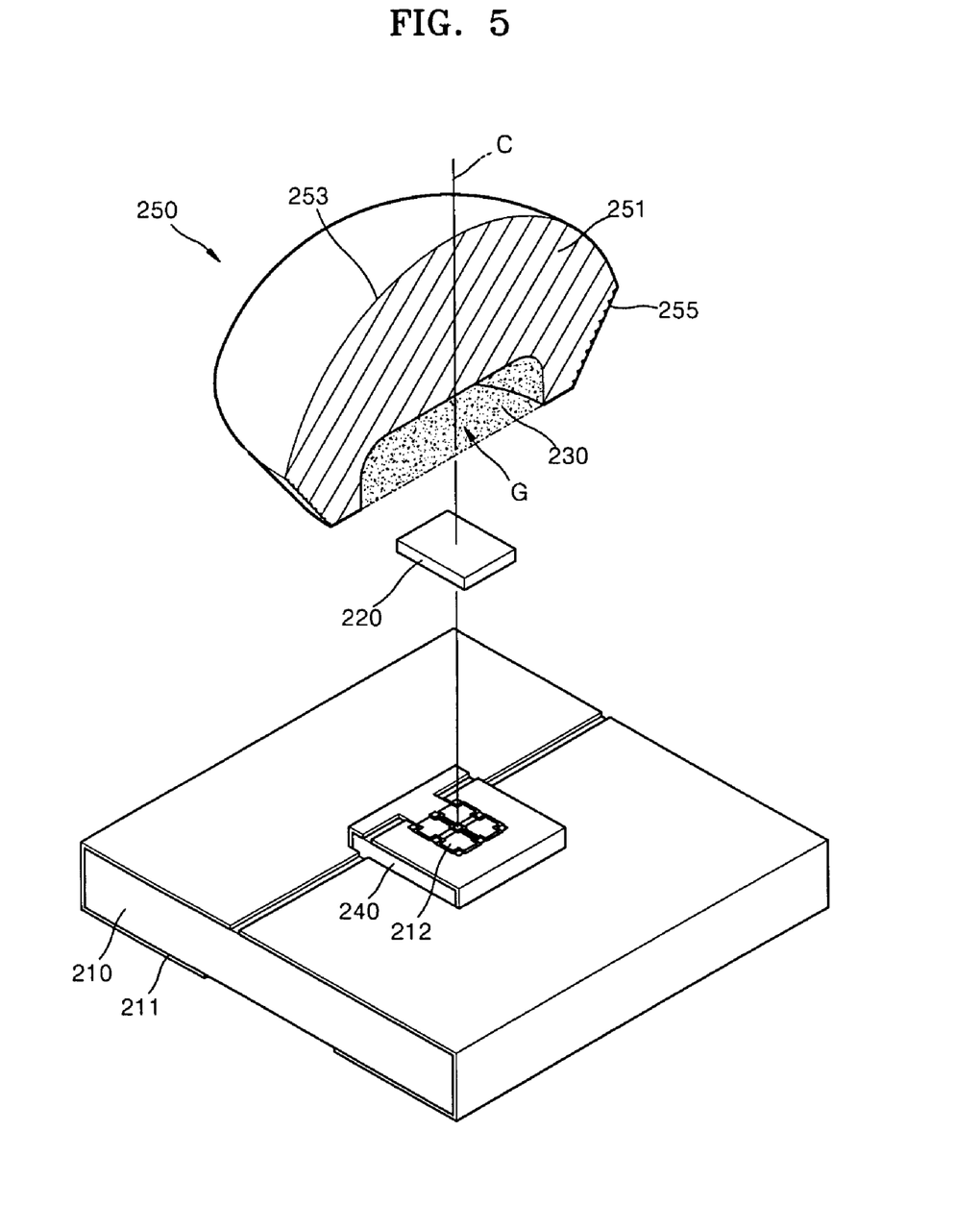
FIG. 5 is an exploded perspective view of a light emitting device package according to a second embodiment of the present invention.

FIG. 5 is a perspective view of a light emitting device package according to a second embodiment of the present invention. Referring to this, a light emitting device 220 is packaged between a base substrate 210 and a molded lens 250. A sealing resin 230 is injected into an inner space G which contains the light emitting device 220, to bond the base substrate 210 to the molded lens 250. A transparent body 251 of the molded lens 250 has a transmission surface 253 through which light is emitted from the light emitting device 220, and a reflective surface 255 inclined inward from the transmission surface 253.

In this embodiment, unlike the first embodiment, a separate sub-mount 240 is interposed between the light emitting device 220 and the base substrate 210. The sub-mount 240 physically and electrically bonds the light emitting device 220 to the base substrate 210. To this end, the sub-mount 240 may first be flip-chip bonded to the base substrate 210 below and then flip-chip bonded to the light emitting device 220 above. The sub-mount 240 functions as a heat sink for discharging heat from the light emitting device 220, and may be formed of a high conductivity insulating material or of a ceramic material such as AlN or SiC. Thus, the sub-mount 240 forms a heat transfer path connecting the light emitting device 220 to the base substrate 210. Also, the sub-mount 240 makes an electrical connection between the base substrate 210 and the light emitting device 220 to supply driving power to the light emitting device 220. A bonding pad 212 is formed on the sub-mount 240 and is bonded to the light emitting device 220. The bonding pad 212 is electrically connected to a wiring pattern 211 that is formed on the base substrate 210.

A method of manufacturing the light emitting device package of the present invention will be described with reference to FIGS. 2 and 3. First, as shown in FIG. 2, the base substrate 110 with a wiring pattern 111 is prepared such that the plurality of bonding pads 112 are provided in a center portion of the base substrate 110. If the sub-mount is mounted on the base substrate separately from the light emitting device, a sub-mount with bonding pads is provided (see FIG. 5). Thereafter, the conductive solder layer or conductive solder bump (not shown) is formed on the bonding pads 112, the light emitting device 120 is safely seated on the base substrate 110, and the light emitting device 120 is conductively bonded to the base substrate 110 with the use of a reflow process. If the sub-mount is mounted on the base substrate, the sub-mount is first flip-chip bonded to the base substrate, and then the light emitting device is flip-chip bonded to the sub-mount. After mounting the light emitting device 120 on the base substrate 110, a test of electrical performance and mechanical durability is performed on the light emitting device assembly.

As shown in FIG. 3, the fluorescent layer 125 is formed on the base substrate 110 to cover the light emitting device 120. The fluorescent layer 125 can be formed by applying a fluorescent substance to a portion of the base substrate 110 using a conventional coater, and the fluorescent substance may be selected according to the product specification and the characteristics of the light emitting device 120. After the formation of the fluorescent layer 125, another test for product reliability is performed that is similar to the above test, to check for degradation of the product during the application of the fluorescent substance.

Thereafter, the molded lens 150 is formed to cover and seal the light emitting device 120. The transparent body 151 of the molded lens 150 may be manufactured by injection-molding the transparent material. In this embodiment, the inner space G is formed therein as a mounting space for the light emitting device 120. The reflective surfaces 155 are formed on the outer sidewalls of the molded lens 150 facing the inner space G. As described above, the reflective surfaces may be formed by depositing a high reflectivity metallic material on a portion of the outer sidewalls of the molded lens, or by inserting the metallic ring member into the outer circumference of the molded lens.

Next, the molded lens 150 is safely seated on the base substrate 110 to seal the light emitting device 120 between the base substrate 110 and the molded lens 150. To this end, the transparent adhesive sealing resin 130, for example an epoxy resin, is applied to the inner space G of the molded lens 150, and the molded lens 150 is placed onto the base substrate 110. Finally, the optical characteristics and mechanical durability of the light emitting device package are evaluated. For example, an optical test such as a measurement of the viewing angle or color coordinates, and a durability test such as by the use of heating or vibration, are performed on the light emitting device package.

Meanwhile, although the drawings show that the sealing resin is injected into the inner space of the molded lens to bond the molded lens to the base substrate, the technical features of the present invention also can be applied when an adhesive resin such as epoxy resin is interposed between the molded lens and the base substrate to bond both without the injection of the sealing resin onto the molded lens.

According to the light emitting device package of the present invention, the reflective surface is formed on the lens, to simplify the packaging structure and assembly process and to reduce the number of parts for packaging. The reflective surface is directly formed on the outer surface of the lens, so that the diffraction pattern for increasing the reflection efficiency can be easily formed, and the light extraction efficiency of the light emitting device can be improved. In addition, the light emitting device package of the present invention is formed of a package structure that is suitable for the use of the flip-chip bonding method between the light emitting device and the wiring pattern.

In the conventional packaging process of the light emitting device, each time after an individual process such as mounting the light emitting device, encapsulation, or mounting the lens has been completed, electrical performance and mechanical durability are tested. In the package of the present invention, the number of essential parts is reduced and the structure is simplified, thereby allowing for the use of fewer tests and minimizing process losses due to defects.

According to the light emitting device package of the present invention, the light emitting device is mounted on the highly heat-conductive substrate having a wide heat-dissipation area, thereby improving the heat-dissipation performance of the light emitting device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A light emitting device package comprising:
   a base substrate on which a wiring pattern is formed;
   a light emitting device mounted on the base substrate to emit light when supplied with driving power through the wiring pattern;
   a molded lens having a bottom surface in contact with the base substrate, an inner space having a space of a cross-sectional shape such that an inner part of the bottom surface is open in the direction of the light emitting device and recessed into the molded lens so that the light emitting device is received in the inner space when the bottom surface of the molded lens makes contact with the base substrate, a reflective side surface being formed to be inclined at the outside of the molded lens adjacent to the bottom surface in order to have an inclined surface wherein the width of the molded lens gradually increases with distance from the base substrate and reflecting light provided from the light emitting diode toward a transmission surface located as an outer surface located opposite to said inner space on the molded lens in order to emit light provided from the light emitting diode and the reflective surface,
   the bottom surface, inner space, reflective surface and transmission surface of the molded lens being formed so as to be a single, unitary transparent body;
   a reflective coating layer formed on the base substrate on which the light emitting device is mounted, the reflective coating layer surrounding the light emitting device underneath thereof and reflecting light emitted from the light emitting device into the molded lens; and
   a sealing resin formed in the inner space for bonding the molded lens to the base substrate.

2. The light emitting device package according to claim 1, wherein the molded lens has a revolution body shape symmetrical about one axis.

3. The light emitting device package according to claim 1, wherein the molded lens is formed of a material selected from the group consisting of glass, thermoplastic polymer, thermosetting polymer, and silicone resin.

4. The light emitting device package according to claim 1, wherein the reflective surfaces are inclined at a predetermined angle with respect to a center axis of the molded lens.

5. The light emitting device package according to claim 4, wherein the angle between both reflective surfaces formed symmetrically about the center axis satisfy the following relationship: $0°<\theta<180°$.

6. The light emitting device package according to claim 1, wherein the outer transmission surface is curved in a semi-spherical shape, and the reflective surface is inclined inward from the outer circumference of the transmission surface.

7. The light emitting device package according to claim 1, wherein the transparent body inside the reflective surface has a diffraction pattern layer consisting of a plurality of continuous diffraction gratings.

8. The light emitting device package according to claim 7, wherein the diffraction pattern layer consists of a plurality of embossed portions.

9. The light emitting device package according to claim 1, wherein the light emitting device is buried in a fluorescent layer converting emitted light of the light emitting device into an effective display light.

10. The light emitting device package according to claim 1, wherein the inner space has a maximum height, measured in the direction of the center axis, less than a maximum height of the reflective surface measured in the direction of the center axis.

11. The light emitting device package according to claim 1, wherein the inner space has a semi-circular cross-section whose bottom surface is open.

12. The light emitting device package according to claim 1, wherein the inner space has a rectangular cross-section whose bottom surface is open.

13. The light emitting device package according to claim 12, wherein the inner space has an angled edge portion defined by a sidewall thereof and a surface opposite to the bottom thereof.

14. The light emitting device package according to claim 12, wherein the inner space has a round edge portion defined by a sidewall thereof and a surface opposite to the bottom thereof, and the round edge portion has a curvature having a diameter equal to the vertical height of the inner space.

15. The light emitting device package according to claim 1, wherein the light emitting device is mounted on the base substrate by the use of means of a flip-chip bonding.

16. The light emitting device package according to claim 1, wherein the base substrate is formed of a ceramic material of SiC, AlN, or Si.

17. The light emitting device package according to claim 1, wherein the reflective coating layer is a metallic layer of Ag or Al.

18. The light emitting device package according to claim 1, wherein the reflective surfaces are formed by laminating a thin film of Ag or Al on a transparent body of the molded lens.

19. A light emitting device package comprising:
   a base substrate on which a wiring pattern is formed;
   a light emitting device mounted on the base substrate to emit light when supplied with driving power through the wiring pattern;
   a sub-mount interposed between the base substrate and the light emitting device to thermally and electrically mediate therebetween;
   a molded lens having a bottom surface in contact with the base substrate, an inner space having a space of a cross-sectional shape such that an inner part of the bottom surface is open in the direction of the light emitting device and recessed into the molded lens so that the light emitting device is received in the inner space when the bottom surface of the molded lens makes contact with the base substrate, a reflective side surface being formed to be inclined at the outside of the molded lens adjacent to the bottom surface in order to have an inclined surface wherein the width of the molded lens gradually increases with distance from the base substrate and reflecting light provided from the light emitting diode toward a transmission surface located as an outer surface located opposite to said inner space on the molded lens in order to emit light provided from the light emitting diode and the reflective surface, the bottom surface, inner space, reflective surface and transmission surface of the molded lens being formed so as to be a single, unitary transparent body;

a sealing resin formed in the inner space for bonding the molded lens to the base substrate; and a loop type ring member of Ag or Al inserted into an outer circumference of the inclined surface of the molded lens, the loop type ring member having a ring-shaped structure and forming the reflective surfaces of the molded lens.

20. The light emitting device package according to claim 19, wherein the transparent body inside the reflective surface has a diffraction pattern consisting of a plurality of continuous gratings.

21. The light emitting device package according to claim 20, wherein the diffraction pattern consists of a plurality of embossed portions.

22. The light emitting device package according to claim 19, wherein the light emitting device is buried in a fluorescent layer for converting emitted light of the light emitting device into an effective display light.

23. The light emitting device package according to claim 19, wherein the inner space has a maximum height, measured in the direction of the center axis, less than a maximum height of the reflective surface measured in the direction of the center axis.

24. The light emitting device package according to claim 19, wherein the inner space has a rectangular in cross-section whose bottom surface is open.

25. The light emitting device package according to claim 19, wherein the inner space has a semi-circular cross-section whose bottom surface is open.

26. The light emitting device package according to claim 19, wherein the light emitting device is mounted on the base substrate by the use of flip-chip bonding.

27. A light emitting device package comprising:

a base substrate on which a wiring pattern is formed;

a light emitting device mounted on the base substrate to emit light when supplied with driving power through the wiring pattern;

a molded lens having a bottom surface in contact with the base substrate, an inner space having a space of a cross-sectional shape such that an inner part of the bottom surface is open in the direction of the light emitting device and recessed into the molded lens so that the light emitting device is received in the inner space when the bottom surface of the molded lens makes contact with the base substrate, a reflective side surface being formed to be inclined at the outside of the molded lens adjacent to the bottom surface in order to have an inclined surface wherein the width of the molded lens gradually increases with distance from the base substrate and reflecting light provided from the light emitting diode toward a transmission surface located as an outer surface located opposite to said inner space on the molded lens in order to emit light provided from the light emitting diode and the reflective surface, the bottom surface, inner space, reflective surface and transmission surface of the molded lens being formed so as to be a single, unitary transparent body;

a reflective coating layer formed on the base substrate on which the light emitting device is mounted, the reflective coating layer surrounding the light emitting device underneath thereof and reflecting light emitted from the light emitting device into the molded lens; and an adhesive resin interposed between the base substrate and the molded lens to provide a bond therebetween.

28. A light emitting device package comprising:

a base substrate on which a wiring pattern is formed;

a light emitting device mounted on the base substrate to emit light when supplied with driving power through the wiring pattern;

a sub-mount interposed between the base substrate and the light emitting device to thermally and electrically connect therebetween;

a molded lens having a bottom surface in contact with the base substrate, an inner space having a space of a cross-sectional shape such that an inner part of the bottom surface is open in the direction of the light emitting device and recessed into the molded lens so that the light emitting device is received in the inner space when the bottom surface of the molded lens makes contact with the base substrate, a reflective side surface being formed to be inclined at the outside of the molded lens adjacent to the bottom surface in order to have an inclined surface wherein the width of the molded lens gradually increases with distance from the base substrate and reflecting light provided from the light emitting diode toward a transmission surface located as an outer surface located opposite to said inner space on the molded lens in order to emit light provided from the light emitting diode and the reflective surface, the bottom surface, inner space, reflective surface and transmission surface of the molded lens being formed so as to be a single, unitary transparent body;

a reflective coating layer formed on the base substrate on which the light emitting device is mounted, the reflective coating layer surrounding the light emitting device underneath thereof and reflecting light emitted from the light emitting device into the molded lens; and an adhesive resin interposed between the base substrate and the molded lens to provide a bond therebetween.

* * * * *